(12) United States Patent
Kwon et al.

(10) Patent No.: US 11,462,713 B2
(45) Date of Patent: Oct. 4, 2022

(54) DISPLAY DEVICE AND MANUFACTURING METHOD THEREOF

(71) Applicant: Samsung Display Co., Ltd., Yongin-si (KR)

(72) Inventors: Seung Wook Kwon, Hwaseong-si (KR); Hyoung Sub Lee, Yongin-si (KR); Woo Yong Sung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/532,100

(22) Filed: Aug. 5, 2019

(65) Prior Publication Data

US 2020/0111992 A1 Apr. 9, 2020

(30) Foreign Application Priority Data

Oct. 5, 2018 (KR) ........................ 10-2018-0118766

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 51/0097* (2013.01); *H01L 27/3244* (2013.01)

(58) Field of Classification Search
CPC ............. H01L 51/5253; H01L 51/5256; H01L 21/0097; H01L 2251/5338; G02F 1/13305; G09F 9/301
See application file for complete search history.

(56) References Cited

U.S. PATENT DOCUMENTS

| 10,693,089 B2 | 6/2020 | He et al. |
| 2014/0062742 A1 | 3/2014 | Nakanishi et al. |
| 2015/0060867 A1 | 3/2015 | Chung et al. |
| 2016/0204366 A1 | 7/2016 | Zhang et al. |
| 2017/0042047 A1 | 2/2017 | Oh |
| 2017/0263887 A1* | 9/2017 | Han et al. ........... H01L 51/5253 |

(Continued)

FOREIGN PATENT DOCUMENTS

| CN | 108198842 A | 6/2018 |
| EP | 1582538 A1 | 10/2005 |

(Continued)

OTHER PUBLICATIONS

European Search Report for European Patent Application No. 19201002.3 dated Feb. 4, 2020.

(Continued)

*Primary Examiner* — Thanhha S Pham
(74) *Attorney, Agent, or Firm* — Cantor Colburn LLP

(57) ABSTRACT

A display device includes: a substrate including a first region, a second region, and a bending region, the bending region connecting the first region and the second region to each other; a display unit disposed on a first surface of the substrate in the first region thereof; in the first region of the substrate, a first passivation layer disposed on a second surface of the substrate which is opposite to the first surface of the substrate; and in the second region of the substrate, a second passivation layer disposed on the second surface of the substrate. Each of the first passivation layer and the second passivation layer includes a photocurable resin which is cured.

15 Claims, 15 Drawing Sheets

(56) References Cited

U.S. PATENT DOCUMENTS

2018/0009197 A1  1/2018  Gross et al.
2018/0178493 A1  6/2018  Fujioka et al.

FOREIGN PATENT DOCUMENTS

| EP | 3300131 A1 | 3/2018 |
|---|---|---|
| KR | 1020130117176 A | 10/2013 |
| KR | 1020170071986 A | 6/2017 |
| KR | 1020170106590 A | 9/2017 |
| KR | 1020170116303 A | 10/2017 |
| KR | 1020170140489 A | 12/2017 |
| WO | 2012086334 A1 | 6/2012 |

OTHER PUBLICATIONS

Anonymous: "Photopolymer—Wikipedia", Feb. 28, 2016 (Feb. 28, 2016), XP055882846, Retrieved from the Internet: URL:https://en.wikipedia.org/wiki/Photopolymer[retrieved on Jan. 24, 2022].
European Search Report for European Patent Application No. 19 201 002.3 dated Feb. 1, 2022.

\* cited by examiner

DISPLAY DEVICE AND MANUFACTURING METHOD THEREOF

This application claims priority to Korean Patent Application No. 10-2018-0118766 filed on Oct. 5, 2018, and all the benefits accruing therefrom under 35 U.S.C. § 119, the entire contents of which are incorporated herein by reference.

BACKGROUND

(a) Field

The present disclosure relates to a display device and a manufacturing method of a display device.

(b) Description of the Related Art

A display device such as a liquid crystal display and an organic light emitting diode display is manufactured by forming various layers and elements on a substrate.

Glass may be used as the substrate of the display device, but the glass substrate is relatively heavy and prone to breakage. In addition, since the glass substrate has a rigid property, deforming the display device may be difficult.

A display device using a substrate which is relatively light in weight, strong against impact, and flexible and easy to deform has been developed. A display device using a flexible substrate may be designed such that an end and the like of a display panel with a pad portion may be bent, and thus a dead space within the display device at which components of the display device are absent may be reduced compared to a display device using a relatively rigid substrate such as a glass substrate.

SUMMARY

Exemplary embodiments have been made in an effort to provide a display device which facilitates bending thereof and for which a manufacturing process thereof is simplified. However, this is only illustrative, and does not limit the scope of the invention.

An exemplary embodiment of the invention provides a display device including: a substrate including a first region, a second region, and a bending region, the bending region connecting the first region and the second region to each other; a display unit disposed on a first surface of the substrate in the first region; in the first region, a first passivation layer disposed on a second surface of the substrate which is opposite to the first surface of the substrate; and in the second region, a second passivation layer disposed on the second surface of the substrate. Each of the first passivation layer and the second passivation layer includes a photocurable resin which is cured.

At the bending region, ends of the first passivation layer and the second passivation layer may be inclined toward the second surface of the substrate.

The first passivation layer and the second passivation layer may be separated from each other, and a space between the first passivation layer and the second passivation layer separated from each other may overlap the bending region.

The first passivation layer and the second passivation layer may be in contact with the second surface of the substrate.

A maximum thickness of the first passivation layer may be 75 micrometers (μm) to about 100 μm.

At the bending region, the end of the first passivation layer may be aligned with the end of the display unit.

The photocurable resin may include at least one cured product of an acrylate polymer, a polyurethane, and an acrylate compound including a SiO.

The photocurable resin may include at least one of an acrylic resin, a butyl rubber, a vinyl acetate resin, an ethylene vinyl acetate ("EVA") resin, a natural rubber, a nitrile, a silicate resin, a silicone rubber, and a styrene block polymer.

Each of the first passivation layer and the second passivation layer may include a first auxiliary layer, a second auxiliary layer, and a third auxiliary layer stacked sequentially from the second surface of the substrate.

A maximum thickness of the second auxiliary layer may be greater than a maximum thickness of the first auxiliary layer and a maximum thickness of the third auxiliary layer.

The third auxiliary layer included in the first passivation layer and the third auxiliary layer included in the second passivation layer may be connected to each other.

The first auxiliary layer may include at least one of an acrylic resin, a butyl rubber, a vinyl acetate resin, an ethylene vinyl acetate ("EVA") resin, a natural rubber, a nitrile, a silicate resin, a silicone rubber, and a styrene block polymer.

The photocurable resin may include at least one cured product of an acrylate polymer, a polyurethane, and an acrylate compound including a SiO.

The third auxiliary layer may include at least one of a urethane acrylate, a polyester acrylate, an epoxy acrylate, a silicone acrylate, and a hydroxy ketone.

An exemplary embodiment of the invention provides a display device including: a substrate including a first region, a second region, and a bending region, the bending region connecting the first region and the second region to each other; a display unit disposed on a first surface of the substrate in the first region thereof; in the first region, a first passivation layer disposed on a second surface of the substrate which is opposite to the first surface of the substrate; and in the second region, a second passivation layer disposed on the second surface of the substrate. Ends of the first passivation layer and the second passivation layer are inclined toward the second surface of the substrate.

An exemplary embodiment of the invention provides a manufacturing method of a display device, including: preparing a display unit including a thin film transistor disposed on a first surface of the substrate; and providing a first passivation layer and a second passivation layer each on a second surface of the substrate which is opposite to the first surface thereof, by applying and curing the photocurable resin on a second surface of the substrate.

In the providing the first passivation layer and the second passivation layer, the photocurable resin may be applied through an inkjet process.

The providing the first passivation layer and the second passivation layer may include multiple applications of the photocurable resin on the second surface of the substrate.

According to the exemplary embodiments, it is possible to provide a display device and a manufacturing method thereof for which bending of the display device is relatively easy, a manufacturing process is simplified, and a misalignment problem of layers on opposing sides of a substrate of the display device is solved. Such effects are illustrative, and do not limit the scope of the invention.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
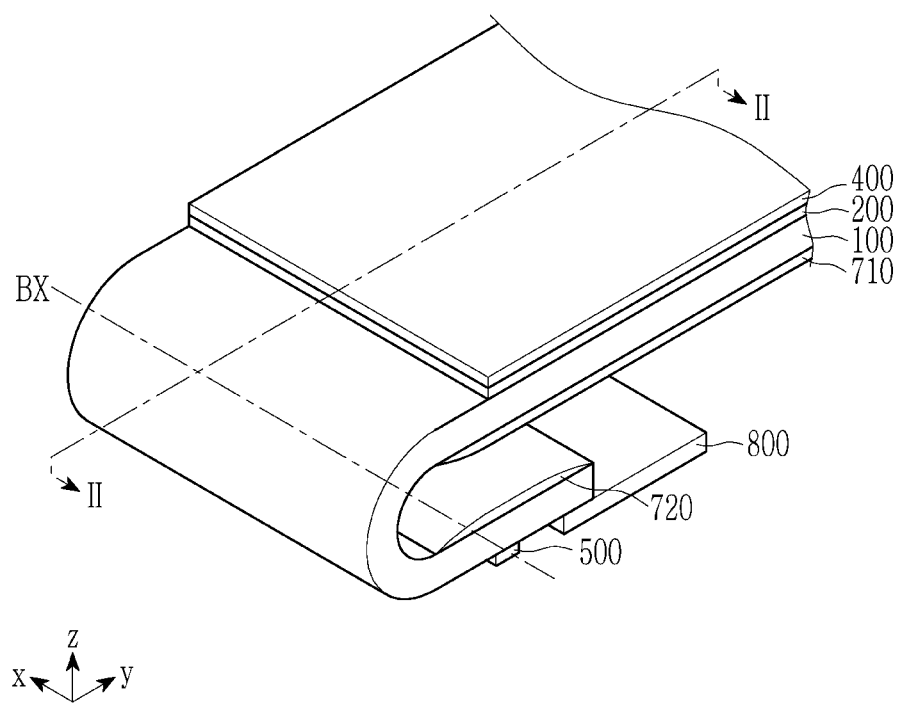
FIG. 1 illustrates a schematic perspective view of an exemplary embodiment of a portion of a display device.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, the word "over" or "on" means positioning on or below the object portion, and does not necessarily mean positioning on the upper side of the object portion based on a gravity direction. Relative terms, such as "rear" or "front" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "rear" side of other elements would then be oriented on the "front" side of the other elements. The exemplary term "rear" can therefore, encompasses both an orientation of "rear" and "front," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, in the specification, the phrase "in a plan view" means when an object portion is viewed from above, and the phrase "in a cross-sectional view" means when a cross-section taken by vertically cutting an object portion is viewed from the side.

A display device according to an exemplary embodiment will now be described with reference to FIG. 1 to FIG. 3. FIG. 1 illustrates a schematic perspective view of an exemplary embodiment of a portion of a display device, FIG. 2 illustrates a cross-sectional view taken along line II-II of FIG. 1, and FIG. 3 illustrates an enlarged cross-sectional view of an exemplary embodiment of a substrate in the display device of FIG. 2, which is unbent.

Figure 2:
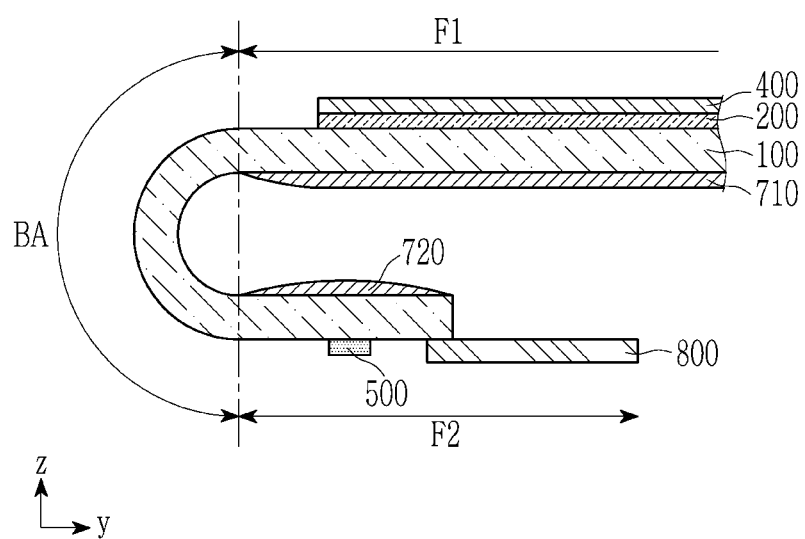
FIG. 2 illustrates a cross-sectional view taken along line II-II of FIG. 1.
Figure 3:
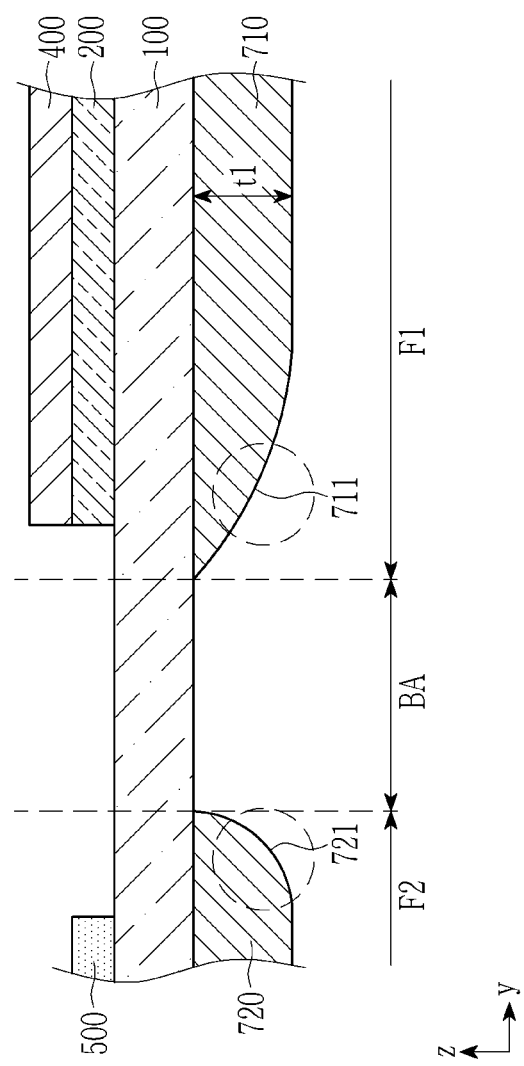
FIG. 3 illustrates an enlarged cross-sectional view showing an exemplary embodiment of a substrate in the display device of FIG. 2, which is unbent.

As illustrated in FIG. 1 and FIG. 2, the display device may have a shape in which a portion of a substrate 100 is bendable. That is, a portion of the display device is bendable similar to the substrate 100 or based on a structure of the substrate 100.

The substrate 100 may include a variety of materials having a flexible or bendable characteristic. In an exemplary embodiment, for example, the substrate 100 may include a polymer resin such as polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), or cellulose acetate propionate.

The substrate 100 includes or defines a first region F1 and a second region F2 which are each in a flat state, and a bending region BA disposed between the first region F1 and the second region F2 along a y-axis direction. The bending region BA connects the first region F1 and the second region F2 to each other. The length of the substrate 100 may be extended along the y-axis direction. The substrate 100 (and the display device) is bendable at the bending region BA. The substrate 100 may be bendable at the bending region BA with respect to a bending axis BX that is parallel to an x-axis direction. The substrate 100 being bendable enables the display device to be bendable at the bending region BA.

Referring to FIG. 2, the display device bent at the bending region BA disposes the first region F1 of the substrate 100 overlapping a display unit 200 and a polarization layer 400 along a z-axis direction. The first region F1 may extend further than an end of the display unit 200 to define a portion of the first region F1 outside the display unit 200 as shown in FIG. 2, but the invention is not limited thereto.

The display unit 200 may include a thin film transistor and a light emitting element connected thereto. This will be described later with reference to FIG. 10. The display unit 200 displays an image, such as with light. Although the present specification describes an embodiment in which the display unit 200 includes a light emitting element, the invention is not limited thereto, and the display unit 200 may include a liquid crystal element.

Although not illustrated in this specification, a display device according to an exemplary embodiment may further include a touch unit disposed between the display unit 200 and the polarization layer 400. The touch unit may detect a contact thereto as external touch information and use such external tough information as an input signal to obtain coordinate information of an input point of the contact. The touch unit may be provided as a separate unit to the display unit 200 and mounted on the display unit 200, or may be formed directly on the display unit 200 and incorporated therein.

The polarization layer 400 may be disposed on the display unit 200. The polarization layer 400 may reduce reflection of external light incident to display device from outside thereof. When external light passes through the polarization layer 400, is reflected by the display unit 200 and then passes through the polarization layer 400 again, a phase of the external light may be changed. As a result, the phase of the reflected light and the phase of the external light entering the polarization layer 400 may be different, so that extinction interference may occur between the reflected light and the external light.

Although not illustrated, an adhesive layer may be disposed between the polarization layer 400 and the display unit 200. The adhesive layer may be a transparent adhesive layer. As an example, the adhesive layer may include an optically clear adhesive ("OCA"), an optically clear resin ("OCR"), or a pressure sensitive adhesive ("PSA").

The first region F1 may include a display area of the display device and/or the display unit 200. An image may be displayed at the display area. The second region F2 and the bending region BA may include a non-display area of the display device and/or the display unit 200, corresponding to an outer circumference region of the display unit 200. An image may not be displayed at the non-display area.

A driver 500 may be disposed in the second region F2 of the substrate 100. The driver 500 may be connected to a pad unit disposed on the substrate 100 to supply a data signal and a gate signal (hereinafter simply referred to as 'signals') to a data line and a gate line (hereinafter simply referred to as "signal lines"), respectively. The pad unit may be disposed in the second region F2. The signal lines may be disposed in the first region F1 and extend therefrom to the second region F2, such as to be connected to the pad unit. The driver 500 may be a driver integrated circuit ("IC") and may be mounted in the pad unit of the substrate 100. In this case, the pad unit may be directly connected electrically to the driver IC. The driver 500 may be used to drive the display unit 200 to display an image.

In addition, a flexible circuit board 800 may be connected to the pad unit of the substrate 100, and the driver IC may be mounted on the flexible circuit board 800. A chip on film ("COF"), a chip on plastic ("COP"), or a flexible printed circuit ("FPC") may be applied to the flexible circuit board 800, and a driver IC for supplying a signal to the display unit 200 may be mounted on the flexible circuit board 800. The flexible circuit board 800 may supply driving and/or control signals to the driver 500, through the pad unit of the substrate 100, without being limited thereto.

Passivation layers 710 and 720 may be disposed on a rear surface of the substrate 100 which is opposite to a front surface on which the display unit 200 is disposed. The front surface may hereinafter be referred to as a "first surface" while the rear surface may be referred to as a "second surface." The display device according to the present exemplary embodiment may include a first passivation layer 710 overlapping the first region F1 and a second passivation layer 720 overlapping the second region F2.

A space between the first passivation layer 710 and the second passivation layer 720 may overlap the bending region BA. That is, no layer of the display device may be disposed on the second surface of the substrate 100 overlapping the bending region BA. Both first and second surfaces of the substrate 100 may be exposed outside the display device at the bending region BA. The space between the first passivation layer 710 and the second passivation layer 720 may correspond to a space defined between the display unit 200 and/or the polarization layer 400, and the driver 500, respectively.

Referring to FIG. 2, the display device bent at the bending region BA disposes the first passivation layer 710 overlapping the second passivation layer 720 along the z-axis direction. The display device bent at the bending region BA disposes portions of the display device in the bending region BA at an end portion of the display device which is bent. Referring to FIG. 2, for example, a portion of the substrate 100 at the space between the first passivation layer 710 and the second passivation layer 720 defines an end portion of the display device which is bent.

The first passivation layer 710 may overlap the first region F1. The first passivation layer 710 may overlap at least first surfaces of the display unit 200 and the polarization layer 400. The first passivation layer 710 may be in direct contact with the substrate 100, without being limited thereto.

The first passivation layer 710 may include or be formed using a photocurable resin. The photocurable resin may include at least one of an acrylate-based polymer, a polyurethane, and an acrylate-based compound including a SiO, and may include any typical material that forms a photocurable resin material without being limited thereto. In an embodiment, for example, the photocurable resin may further include a photoinitiator, a heat stabilizer, an antioxidant, an antistatic agent, or a slip agent.

The photocurable resin may further include at least one of an acrylic resin, a butyl rubber, a vinyl acetate resin, an ethylene vinyl acetate ("EVA") resin, a natural rubber, a nitrile, a silicate resin, a silicone rubber, and a styrene block polymer according to an exemplary embodiment. When the photocurable resin further includes at least one of the above materials, the photocurable resin may have improved adhesion.

The first passivation layer 710 may include the photocurable resin which is cured to define a cured product thereof, as described above. That is, the first passivation layer 710 may include at least one cured product of an acrylate-based polymer, a polyurethane, and an acrylate-based compound including a SiO. The first passivation layer 710 may further include a photoinitiator, a heat stabilizer, an antioxidant, an antistatic agent, or a slip agent remaining in the first passivation layer 710 after the photocurable resin is cured (e.g., in the cured product).

The first passivation layer 710 may include at least one of an acrylic resin, a butyl rubber, a vinyl acetate resin, an ethylene vinyl acetate ("EVA") resin, a natural rubber, a nitrile, a silicate resin, a silicone rubber, and a styrene block polymer according to an exemplary embodiment. When the first passivation layer 710 includes at least one of the above materials, the first passivation layer 710 may have better adhesion. The adhesion of the first passivation layer 710 including the material may be about 10 gram-force per square inch (g·force/inch$^2$) to about 50 g·force/inch$^2$.

When the first passivation layer 710 has predetermined adhesion, adhering a lower protective film (not shown) on the first passivation layer 710 in the manufacturing process may be relatively easy. The lower protective film may reduce or effectively prevent impurities from flowing into the display device during the manufacturing process or the occurrence of scratches.

The first passivation layer 710 may further include beads or elements with which a relatively uneven or rough surface may be defined. Some surfaces of the first passivation layer 710, including the beads, may be rough.

An end 711 of the first passivation layer 710 may be disposed closest to the bending region BA, among opposing ends of the first passivation layer 710 along the y-axis direction. The first passivation layer 710 may have an inclined shape extended in a direction from the end 711 toward an end of the first passivation layer 710 which is disposed furthest from the bending region BA, such as where the display unit 200 overlaps a surface of the substrate 100. The first passivation layer 710 may become thinner along the z-axis direction, as a distance to the bending region BA decreases along the substrate 100. In other words, the end 711 of the first passivation layer is inclined toward the second surface of the substrate 100 along a direction from the first region F1 to the bending region BA.

In an exemplary embodiment of manufacturing a display device, the first passivation layer 710 is formed by curing coated photocurable resin through a printing process, e.g., an inkjet process. The first passivation layer 710 may have a tapered shape at the end 711, owing to a process in which a photocurable resin is cured.

A maximum thickness t1 of the first passivation layer 710 may be from about 75 micrometers (μm) to about 100 μm. When the maximum thickness t1 of the first passivation layer 710 is less than about 75 μm, protecting the substrate 100 and the display unit 200 by using the first passivation layer 710 alone may be difficult, and when the maximum thickness t1 of the first passivation layer 710 is greater than about 100 μm, a thickness of the display device may excessively increase to an undesired maximum thickness.

The second passivation layer 720 may overlap the second region F2, and may partially overlap the driver 500 and the flexible circuit board 800 according to an exemplary embodiment.

In an exemplary embodiment of manufacturing a display device, the second passivation layer 720 may be formed through the same process as the first passivation layer 710, and may include the same material as the first passivation layer 710. As used herein, elements may include the same material as each other, by being formed from a same material layer. As used herein, elements including the same material as each other and/or being formed from a same material layer may be disposed in a same layer among layers disposed on the substrate 100.

In an exemplary embodiment of manufacturing a display device, the second passivation layer 720 may be formed using a photocurable resin. The photocurable resin may include at least one of an acrylate-based polymer, a polyurethane, and an acrylate-based compound including SiO, and may include any typical material that forms a photocurable resin without being limited thereto. In an exemplary embodiment, for example, the photocurable resin may further include a photoinitiator, a heat stabilizer, an antioxidant, an antistatic agent, or a slip agent.

The photocurable resin may be at least one of an acrylic resin, a butyl rubber, a vinyl acetate resin, an ethylene vinyl acetate ("EVA") resin, a natural rubber, a nitrile, a silicate resin, a silicone rubber, and a styrene block polymer according to an exemplary embodiment. When the photocurable resin further includes the above material, the photocurable resin may have improved adhesion. The adhesion of the second passivation layer 720 including the material may be about 10 g·force/inch$^2$ to about 50 g·force/inch$^2$.

When the second passivation layer 720 has predetermined adhesion, adhering of a lower protective film on the second passivation layer 720 in the manufacturing process, may be relatively easy. The lower protective film may reduce or effectively prevent impurities from flowing into the display device during the manufacturing process or the occurrence of scratches and the like.

The second passivation layer 720 may include the photocurable resin which is cured to define a cured product thereof as described above. That is, the second passivation layer 720 may include at least one cured product of an acrylate-based polymer, a polyurethane, and an acrylate-based compound including a SiO. The second passivation layer 720 may further include a photoinitiator, a heat stabilizer, an antioxidant, an antistatic agent, or a slip agent remaining in the second passivation layer 720 after the photocurable resin is cured (e.g., in the cured product).

The second passivation layer 720 may include at least one of an acrylic resin, a butyl rubber, a vinyl acetate resin, an ethylene vinyl acetate ("EVA") resin, a natural rubber, a nitrile, a silicate resin, a silicone rubber, and a styrene block polymer according to an exemplary embodiment. When the second passivation layer 720 includes at least one of the above materials, the second passivation layer 720 may have better adhesion.

The second passivation layer 720 may further include beads or elements with which a relatively uneven or rough surface may be defined. Some surfaces of the second passivation layer 720, including the beads, may be rough.

An end 721 of the second passivation layer 720 may be disposed closest to the bending region BA, among opposing ends of the second passivation layer 720 along the y-axis direction. The second passivation layer 720 may have an inclined shape extended in a direction from the end 721 toward an end 721 of the second passivation layer 720 which is disposed furthest from the bending region BA, such as where the driver 500 or the flexible circuit board 800 overlaps a surface of the substrate 100. The second passivation layer 720 may become thinner along the z-axis direction, as a distance to the bending region BA decreases along the substrate 100. In other words, the end 721 of the second passivation layer is inclined toward the second surface of the substrate 100 along a direction from the second region F2 to the bending region BA.

In an exemplary embodiment of manufacturing a display device, the second passivation layer 720 is formed by curing coated photocurable resin through a printing process, e.g., an inkjet process. The second passivation layer 720 may have a tapered shape at the end 721, owing to a process in which a photocurable resin is cured.

A maximum thickness of the second passivation layer 720 may be equal to the maximum thickness t1 of the first passivation layer 710 and may be, for example, about 75 μm to about 100 μm. The first passivation layer 710 and/or the second passivation layer 720 may define a minimum thickness thereof at the bending region BA. The minimum thickness may be defined by an absence of the first passivation layer 710 and the second passivation layer 720, respectively, at the bending region BA, without being limited thereto. In another exemplary embodiment, a portion of first passivation layer 710 and/or the second passivation layer 720 may be disposed at the bending region BA and define the minimum thickness as compared to remaining thicknesses of such layers.

According to an exemplary embodiment, the first passivation layer 710 and the second passivation layer 720 are formed by applying and curing a photocurable resin in a printing process (e.g., an inkjet process), thereby facilitating formation of a pattern such that no additional layer is disposed on the substrate 100 in the bending region BA of the substrate 100.

Further, applying and curing a photocurable resin in a printing process (e.g., an inkjet process) may relatively easily provide the first and second passivation layers 710 and 720, even without a separate adhesive layer.

Since the respective ends 711 and 721 of the first passivation layer 710 and the second passivation layer 720 are inclined toward the substrate 100 as a distance to the bending region BA decreases along y-axis direction, a space between the ends 711 and 721 of the first passivation layer 710 and the second passivation layer 720 may be easily provided for the process of bending the substrate 100 at such space. Furthermore, the first passivation layer 710 and the second passivation layer 720 may reduce or effectively prevent impurities from flowing into the substrate 100 and the display unit 200, or scratches from occurring during the manufacturing process.

Figure 4:
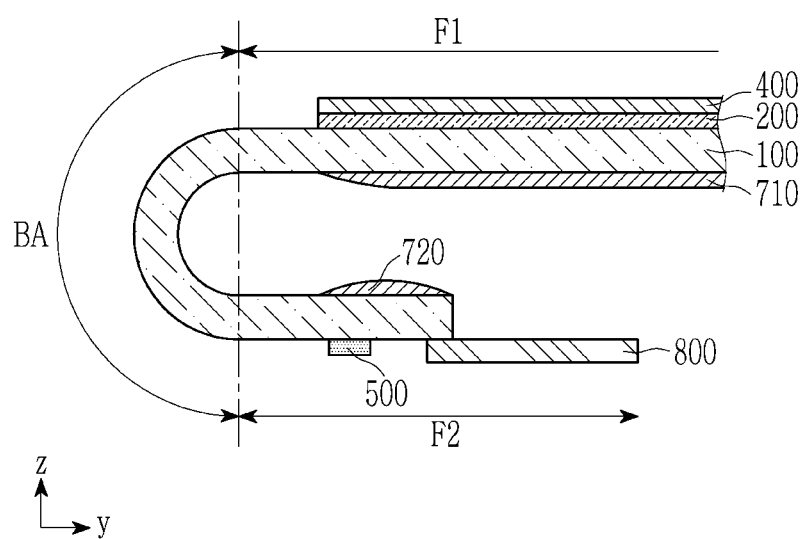
FIG. 4 illustrates a cross-sectional view of a modified exemplary embodiment of a display device.
Figure 5:
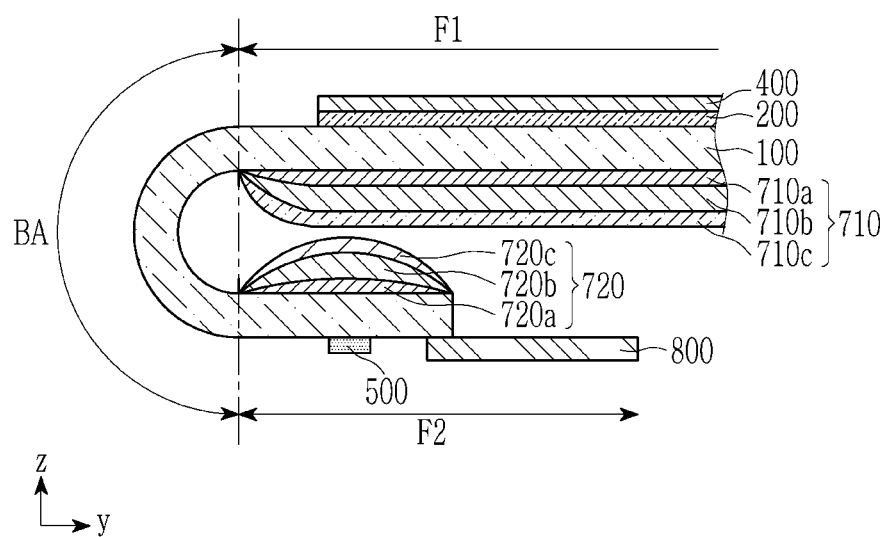
FIG. 5 illustrates a cross-sectional view of another exemplary embodiment of a display device.
Figure 6:
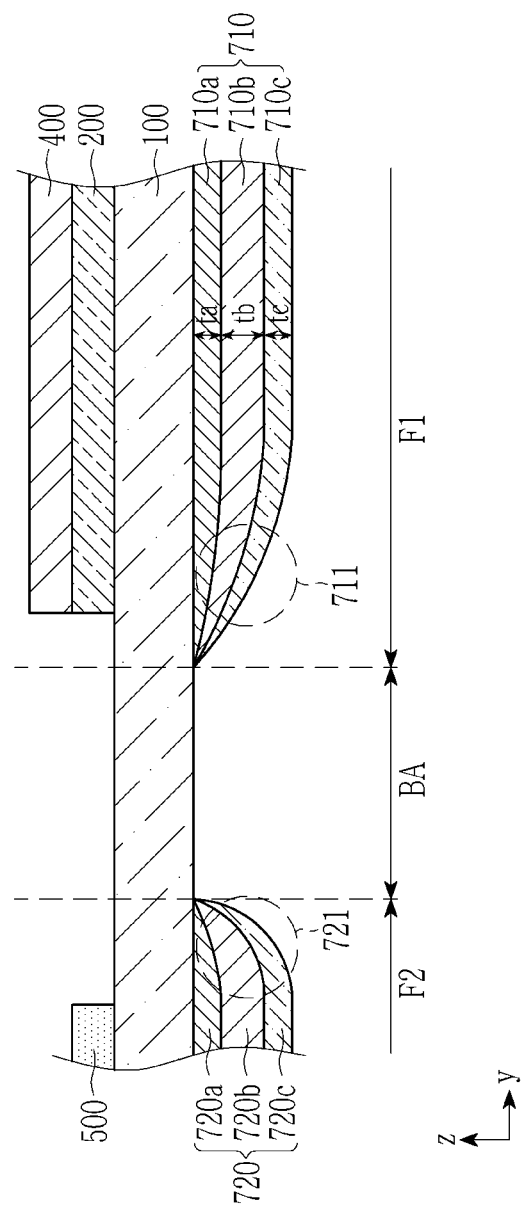
FIG. 6 illustrates an enlarged cross-sectional view showing an exemplary embodiment of a substrate in the display device of FIG. 5, which is unbent.
Figure 7:
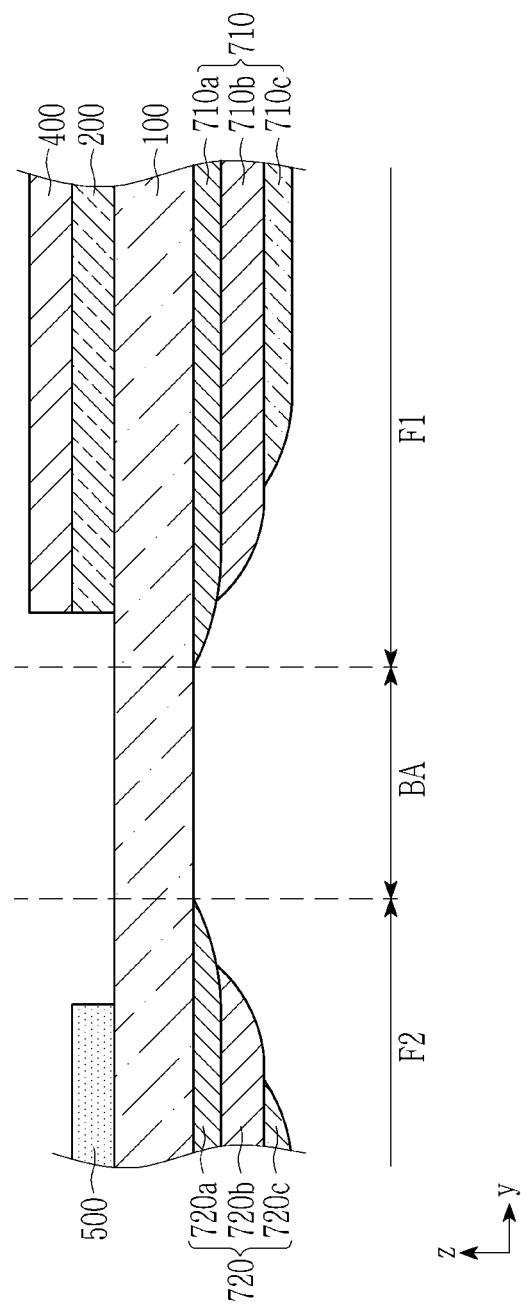
FIG. 7 illustrates an enlarged cross-sectional view of a modified exemplary embodiment of a substrate in a display device, which is unbent.
Figure 8:
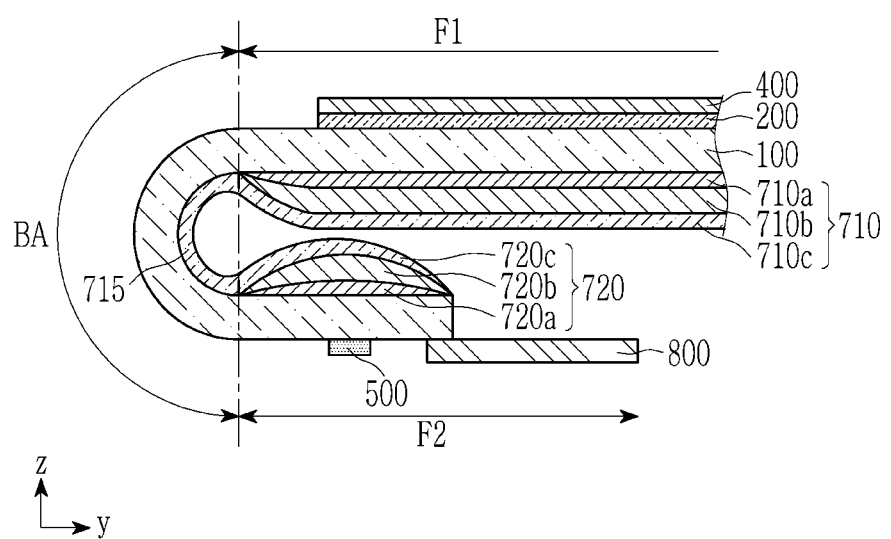
FIG. 8 illustrates a cross-sectional view of still another exemplary embodiment of a display device.
Figure 9:
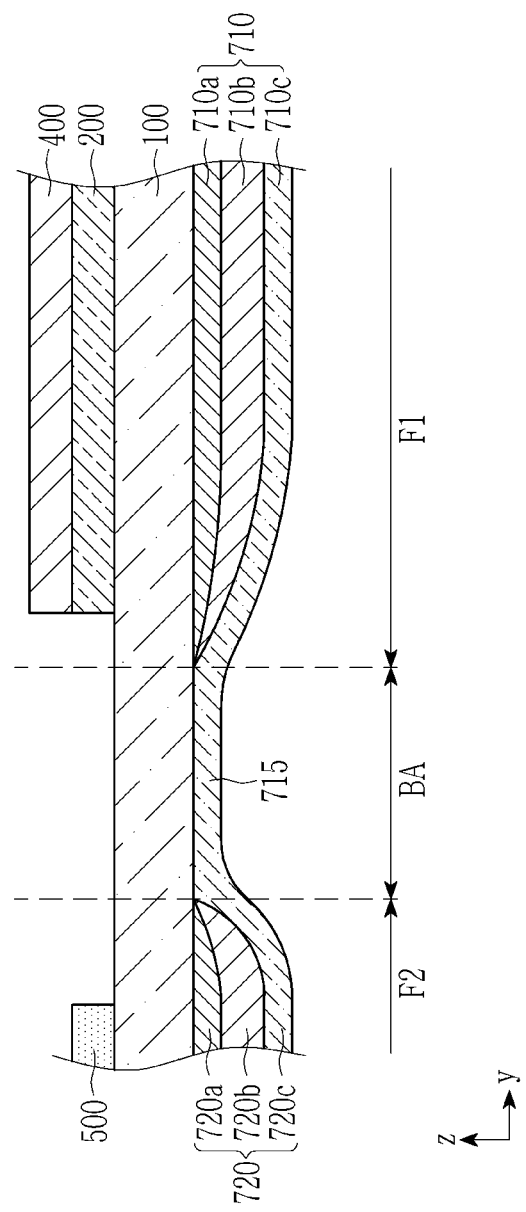
FIG. 9 illustrates an enlarged cross-sectional view of an exemplary embodiment of a substrate in the display device of FIG. 8, which is unbent.

A display device according to another exemplary embodiment will now be described with reference to FIG. 4 to FIG. 9. FIG. 4 illustrates a cross-sectional view of a modified exemplary embodiment of a display device, FIG. 5 illustrates a cross-sectional view of another exemplary embodiment of a display device, FIG. 6 illustrates an enlarged cross-sectional view of an exemplary embodiment of a substrate in the display device of FIG. 5, which is unbent, FIG. 7 illustrates an enlarged cross-sectional view of a modified exemplary embodiment of a substrate in a display device, which is unbent, FIG. 8 illustrates a cross-sectional view of still another exemplary embodiment of a display device, and FIG. 9 illustrates an enlarged cross-sectional view of an exemplary embodiment of a substrate in the display device of FIG. 8, which is unbent. A description of same constituent elements as the constituent elements described above with reference to FIG. 1 to FIG. 3 will be omitted.

Referring to FIG. 4, the end 711 of the first passivation layer 710 which is closest to the bending region BA may substantially coincide with ends (or edges) of the display unit 200 and/or the polarization layer 400. In an exemplary embodiment of manufacturing a display device, the first passivation layer 710 may be formed through a printing process (e.g., an inkjet process). When the first passivation layer 710 is formed through the printing process, the alignment of the first passivation layer 710 with ends of other components within the display device may be easily controlled, and ends of the first passivation layer 710 and the display unit 200 may be aligned with each other.

Referring to FIG. 4, the end 721 of the second passivation layer 720 which is closest to the bending region BA may substantially coincide with ends of the display unit 200 and/or the polarization layer 400. In an exemplary embodiment of manufacturing a display device, the second passivation layer 720 may be formed through a printing process (e.g., an inkjet process). When the second passivation layer 720 is formed through the printing process, the alignment of the second passivation layer 720 with ends of other components within the display device may be easily controlled, and ends of the first second passivation layer 720 and the display unit 200 may be aligned with each other.

As the end 711 of the first passivation layer 710 and/or the end 721 of the second passivation layer 720 is substantially aligned with the end of the display unit 200, an area occupied by the dead space or bezel of the display device may be reduced.

Referring to FIG. 5 and FIG. 6, at least one of the first passivation layer 710 and the second passivation layer 720 may include a plurality of layers. In an embodiment, for example, each of the first passivation layer 710 and the second passivation layer 720 may respectively include a first auxiliary layer 710a or 720a, a second auxiliary layer 710b or 720b, and a third auxiliary layer 710c or 720c. This specification illustrates an exemplary embodiment in which each of the first passivation layer 710 and the second passivation layer 720 respectively includes the first auxiliary layer 710a and 720a, the second auxiliary layer 710b and 720b, and the third auxiliary layer 710c or 720c, but the invention is not limited thereto. In another exemplary embodiment, only one among the first passivation layer 710 and the second passivation layer 720 may have a multi-layer structure defined by a plurality of auxiliary layers as described above.

In an exemplary embodiment of manufacturing a display device, the first auxiliary layers 710a and 720a, the second auxiliary layers 710b and 720b, and the third auxiliary layers 710c and 720c may be respectively formed through separate printing processes.

Each of the first auxiliary layers 710a and 720a, the second auxiliary layers 710b and 720b, and the third auxiliary layers 710c and 720c may include a cured product of a photocurable resin. The cured product of the photocurable resin may independently include a photoinitiator, a heat stabilizer, an antioxidant, an antistatic agent, or a slip agent.

Each of the auxiliary layers within the first passivation layer 710 may define an end 711 closest to the bending region BA along the y-axis direction. Similarly, each of the auxiliary layers within the second passivation layer 720 may define an end 721 closest to the bending region BA along the y-axis direction. The respective ends 711 and 721 of the first auxiliary layers 710a and 720a, the second auxiliary layers 710b and 720b, and the third auxiliary layers 710c and 720c may have an inclined shape along the y-axis direction in which a thickness thereof decreases toward a second surface of the substrate 100.

The ends 711 and 721 of the first auxiliary layers 710a and 720a may be covered by the ends 711 and 721 of the second auxiliary layers 710b and 720b and the third auxiliary layers 710c and 720c, and the ends 711 and 721 of the second auxiliary layers 710b and 720b may be covered by the ends 711 and 721 of the third auxiliary layers 710c and 720c. As being covered, the ends 711 and 721 of the various auxiliary layers within the first passivation layer 710 and the second passivation layer 720 may be aligned with each other, without being limited thereto.

Each of the first auxiliary layers 710a and 720a, the second auxiliary layers 710b and 720b, and the third auxiliary layers 710c and 720c may have a smooth cross-section, without being limited thereto. As a smooth cross-section, one or more of the first auxiliary layers 710a and 720a, the second auxiliary layers 710b and 720b, and the third auxiliary layers 710c and 720c may have a cross-sectional shape that is inclined toward the back surface of the substrate 100.

The first auxiliary layers 710a and 720a may be in contact with the second surface of the substrate 100. The second surface of the substrate 100 opposes a portion of the first surface of the substrate 100 on which the display unit 200 is disposed.

A maximum thickness ta of the first auxiliary layer 710a or 720a may be about 5 μm to about 20 μm. When the maximum thickness ta of the first auxiliary layer 710a or 720a is less than about 5 μm, providing a minimum level of adhesion may be difficult, and when the maximum thickness ta of the first auxiliary layer 710a or 720a is greater than about 20 μm, the thickness occupied by the first passivation layer 710 or the second passivation layer 720 may be excessively large.

The first auxiliary layer 710a or 720a may include at least one of an acrylic resin, a butyl rubber, a vinyl acetate resin, an ethylene vinyl acetate ("EVA") resin, a natural rubber, a nitrile, a silicate resin, a silicone rubber, and a styrene block polymer according to an exemplary embodiment. The first auxiliary layer 710a or 720a may provide adhesion for bonding between the substrate 100 and the first passivation layer 710 and between the substrate 100 and the second passivation layer 720.

The second auxiliary layer 710b or 720b is disposed between the first auxiliary layer 710a or 720a and the third auxiliary layer 710c or 720c, respectively.

A maximum thickness tb of the second auxiliary layer 710b or 720b may be about 45 μm to about 80 μm. When the maximum thickness tb of the second auxiliary layer 710b or 720b is smaller than about 45 μm, protection of the substrate 100 or the display unit 200 by the first passivation layer 710 and the second passivation layer 720 may be difficult, and when the maximum thickness tb of the second auxiliary layer 710b or 720b is greater than about 80 μm, the thickness occupied by the first passivation layer 710 or the second passivation layer 720 may be excessively large.

The maximum thickness of the second auxiliary layer 710b or 720b may be greater than the maximum thickness of the first auxiliary layer 710a or 720a and the maximum thickness of the third auxiliary layer 710c or 720c, respectively.

The second auxiliary layer 710b or 720b may include at least one cured product of an acrylate-based polymer, a polyurethane, and an acrylate-based compound including a SiO. The second auxiliary layers 710b and 720b may respectively allow the first passivation layer 710 and the second passivation layer 720 to have predetermined elasticity.

The third auxiliary layers 710c and 720c are disposed above the second auxiliary layers 710b and 720b. The third auxiliary layers 710c and 720c are auxiliary layers that are disposed farthest from the second surface of the substrate 100. The third auxiliary layers 710c and 720c may reduce or effectively prevent impurities from flowing into the substrate 100 and the display unit 200, or scratches from occurring during the manufacturing process.

A maximum thickness tc of the third auxiliary layer 710c or 720c may be about 10 μm to about 20 μm. When the maximum thickness tc of the third auxiliary layer 710c or 720c is smaller than about 10 μm, protection of other auxiliary layers by third auxiliary layer 710c or 720c may be difficult, and when the maximum thickness tc of the third auxiliary layer 710c or 720c is greater than about 20 μm, a thickness occupied by the first passivation layer 710 and the second passivation layer 720 may be excessively increased.

The third auxiliary layer 710c or 720c may include at least one of, e.g., a urethane acrylate, a polyester acrylate, an epoxy acrylate, a silicone acrylate, and a hydroxy ketone.

The third auxiliary layer 710c or 720c may further include beads. Some surfaces of the third auxiliary layers 710c and 720c, including the beads, may be rough.

Referring to FIG. 7, each respective end 711 and 721 of the first auxiliary layers 710a and 720a, the second auxiliary layers 710b and 720b, and the third auxiliary layers 710c and 720c may have a shape that is different from the shape illustrated in FIG. 6.

Where the first auxiliary layers 710a and 720a extend further toward the bending region BA than the second auxiliary layers 710b and 720b and the third auxiliary layers 710c and 720c, the ends 711 and 721 of the first auxiliary layers 710a and 720a may be exposed from the second auxiliary layers 710b and 720b and the third auxiliary layers 710c and 720c. Similarly where the second auxiliary layers 710b and 720b extend further toward the bending region BA than the third auxiliary layers 710c and 720c, the ends 711 and 721 of the second auxiliary layers 710b and 720b may be exposed from the third auxiliary layers 710c and 720c.

The collective ends 711 and 721 of the first auxiliary layers 710a and 720a, the second auxiliary layers 710b and 720b, and the third auxiliary layers 710c and 720c may define a relatively smooth stepped shape, for example. Unlike the exemplary embodiment of FIG. 6, each of the ends 711 and 721 of the first auxiliary layer 710a and 720a, the second auxiliary layer 710b and 720b and the third auxiliary layer 710c and 720c may have an unordered shape since the ends 711 and 721 cover or are aligned with each other at the bending region BA.

Referring to FIG. 8 and FIG. 9, in a display device according to still another exemplary embodiment, the third auxiliary layer 710c included in the first passivation layer 710 and the third auxiliary layer 720c included in the second passivation layer 720 may be connected to each other.

The third auxiliary layer 720c included in the first passivation layer 710 and the third auxiliary layer 720c included in the second passivation layer 720 may be connected to each other through a connector 715 disposed in the bending region BA.

As illustrated in FIG. 9, the third auxiliary layer 710c included in the first passivation layer 710, the third auxiliary layer 720c included in the second passivation layer 720, and a connector 715 disposed in the bending region BA may constitute one layer, in a state in which the substrate 100 is unbent. One or both of the third auxiliary layers 710c and 720 may define the connector 715. In an exemplary embodiment of manufacturing a display device, the third auxiliary layer 710c included in the first passivation layer 710, the third auxiliary layer 720c included in the second passivation layer 720, and the connector 715 disposed in the bending region BA may be formed through a single process, such as from a single material layer.

A thickness of the connector 715 may be equal to the thickness of the third auxiliary layer 710c or 720c, and may be, e.g., about 10 µm to about 20 µm. Even when the connector 715 is disposed in the bending region BA, the substrate 100 may be bent sufficiently when the thickness is as described above.

Figure 10:
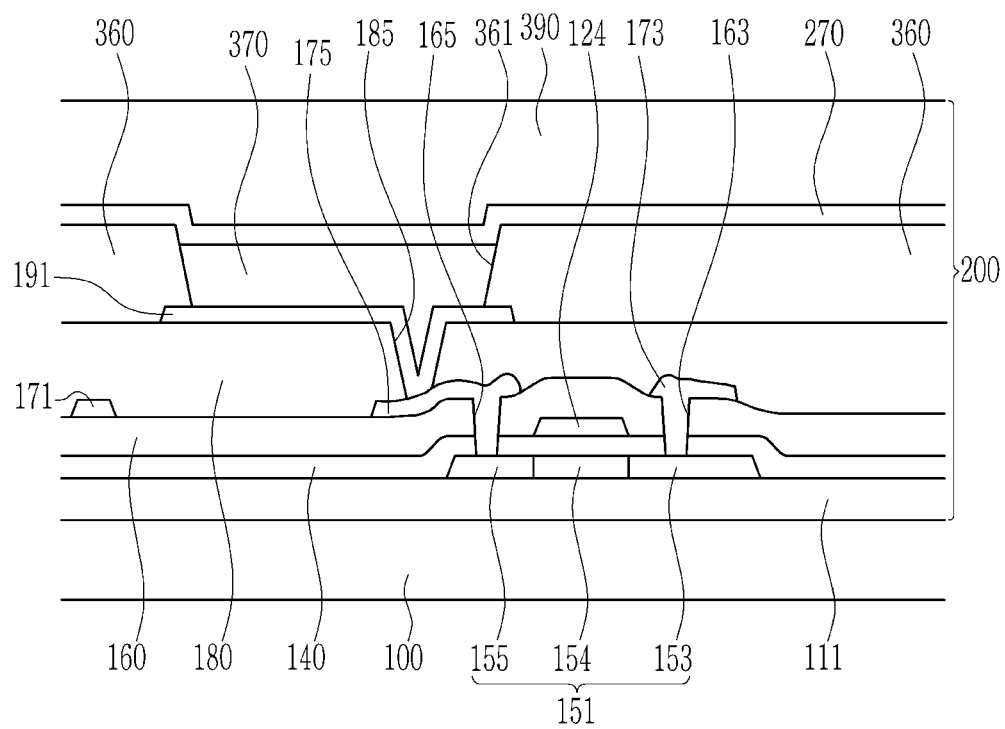
FIG. 10 illustrates an enlarged cross-sectional view of an exemplary embodiment of a thin film transistor and a light emitting diode included in a display unit of a display device.

Hereinafter, the thin film transistor and the light emitting element included in the display unit 200 will be described with reference to FIG. 10. FIG. 10 illustrates an enlarged cross-sectional view of an exemplary embodiment of a thin film transistor and a light emitting diode included in a display unit.

The display unit 200 includes a buffer layer 111 disposed on the substrate 100. The buffer layer 111 may be disposed on a first surface of the substrate 100. The buffer layer 111 may include or be made of an organic material such as a silicon oxide (SiOx), a silicon nitride (SiNx), or the like. The buffer layer 111 may be a single layer or monolayer, or a plurality of layers.

The buffer layer 111 may flatten a surface of the substrate 100 by providing a relatively flat surface, or may reduce or effectively prevent the diffusion of impurities which deteriorate characteristics of a semiconductor layer 151 which will be described later, such as diffusion from penetration of moisture or the like. According to an exemplary embodiment, the buffer layer 111 may be omitted.

The semiconductor layer 151 of the thin film transistor is disposed on the buffer layer 111. The semiconductor layer 151 includes a channel region 154, and a source region 153 and a drain region 155 disposed at opposite sides of the channel region 154 and doped such as with impurities.

The semiconductor layer 151 may include polysilicon, amorphous silicon, or an oxide semiconductor.

A gate insulating layer 140 is disposed on the semiconductor layer 151. The gate insulating layer 140 may be disposed to overlap the first surface of the substrate 100.

The gate insulating layer 140 may include an inorganic insulating material such as a silicon oxide (SiOx), a silicon nitride (SiNx), and the like.

A gate conductor including a gate electrode 124 of the thin film transistor is disposed on the gate insulating layer 140. The gate electrode 124 may overlap the channel region 154 of the semiconductor layer 151. The gate conductor may further include the gate line described above. The gate electrode 124 may be defined by a portion of the gate line without being limited thereto.

An interlayer insulating layer 160 including an inorganic insulating material or an organic insulating material is disposed on the gate electrode 124.

A data conductor including a source electrode 173 and a drain electrode 175, a data line 171, a driving voltage line (not illustrated), and the like of the thin film transistor is disposed on the interlayer insulating layer 160. The source electrode 173 and the drain electrode 175 may be respectively connected to the source region 153 and the drain region 155 of the semiconductor layer 151 through contact holes 163 and 165 defined in the interlayer insulating layer 160 and the gate insulating layer 140, respectively.

The gate electrode 124, the source electrode 173, and the drain electrode 175 constitute a thin film transistor together with the semiconductor layer 151. The thin film transistor illustrated therein may be a driving transistor included in one pixel of a light emitting diode display as the display unit 200. The illustrated thin film transistor may be referred to as a top-gate transistor because the gate electrode 124 is disposed above the semiconductor layer 151. The structure of the transistor is not limited to thereto, and may be variously changed. In an exemplary embodiment, for example, the thin film transistor of the display unit 200 may be a bottom-gate transistor in which the gate electrode is disposed below the semiconductor layer.

A planarization layer 180 is disposed on the interlayer insulating layer 160 and the data conductor. The planarization layer 180 may serve to eliminate steps formed by height differences of underlying layers and perform a planarization (e.g., flattening) function to increase luminous efficiency of the light emitting diode display to be formed thereon. The planarization layer 180 may cover the thin film transistor while overlapping the thin film transistor.

A pixel electrode 191 is disposed on the planarization layer 180. The pixel electrode 191 may be connected to the drain electrode 175 of the thin film transistor through a contact hole 185 defined in the planarization layer 180.

A partition wall 360 is disposed on the planarization layer 180 and the pixel electrode 191. The partition wall 360 may overlap a portion of the pixel electrode 191. The partition wall 360 has an opening 361 defined therein overlapping a portion of the pixel electrode 191. The partition wall 360 may be a pixel-defining layer which defines the pixel of the display unit 200.

The partition wall 360 may include, but is not limited to, an organic insulating material such as a polyimide, a polyacrylate, and a polyamide.

An emission layer 370 is disposed in the pixel electrode 191. The emission layer 370 includes or defines a light emitting region. The light emitting region may correspond to the opening 361 defined by portions of the partition wall 360. The emission layer 370 may additionally include at least one of a hole injection region, a hole transport region, an electron injection region, and an electron transport region.

The emission layer 370 may include an organic material that uniquely emits light of a basic color such as red, green, and blue. Alternatively, the emission layer 370 may have a structure in which a plurality of organic materials emitting light of different colors are stacked. Alternatively, the emission layer 370 may an inorganic material that emits light such as red, green, and blue.

A common electrode 270 for transferring a common voltage is disposed on the emission layer 370 and the partition wall 360.

The pixel electrode 191, the emission layer 370, and the common electrode 270 of each pixel constitute a light emitting element, which is referred to a light emitting diode ("LED"). The pixel electrode 191 may be an anode which is a hole injection electrode, and the common electrode 270 may be a cathode which is an electron injection electrode. Conversely, the pixel electrode 191 may be a cathode, and the common electrode 270 may be an anode. When holes and electrons are injected from the pixel electrode 191 and the common electrode 270 into the emission layer 370, excitons formed by combining the injected holes and electrons are emitted when they fall from an excited state to a ground state.

An encapsulation layer 390 may be located on the common electrode 270. The encapsulation layer 390 may include a plurality of inorganic layers, or may include a structure in which an inorganic layer and an organic layer are alternately stacked.

A manufacturing method of a display device according to an exemplary embodiment will now be described with reference to FIG. 11 to FIG. 15. FIG. 11, FIG. 12, FIG. 13, FIG. 14, and FIG. 15 are each an enlarged cross-sectional view illustrating processes in an exemplary embodiment of a method of manufacturing a display device.

Figure 11:
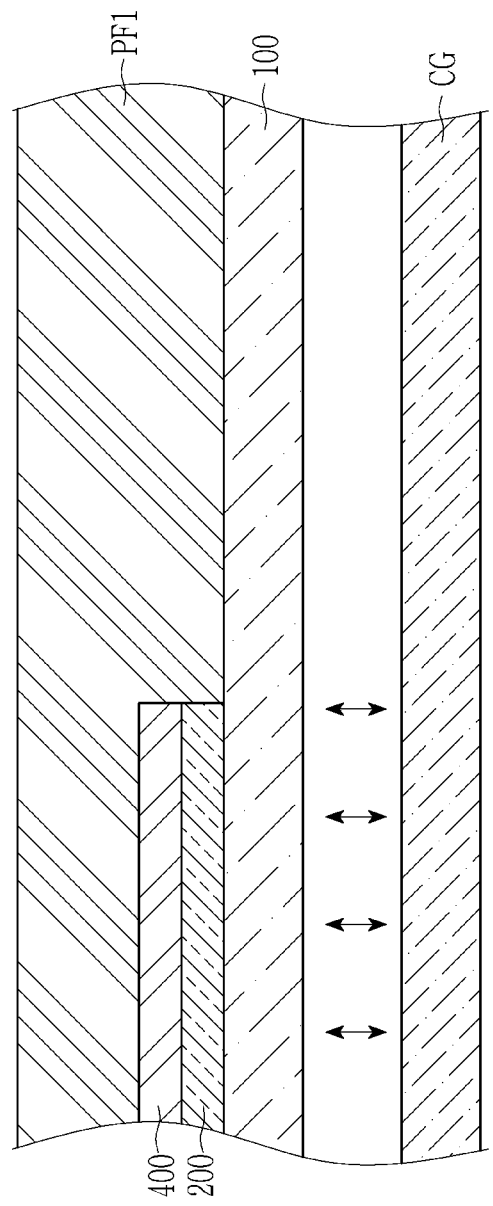
FIG. 11, FIG. 12, FIG. 13, FIG. 14, and FIG. 15 are each an enlarged cross-sectional view illustrating processes in an exemplary embodiment of a method of manufacturing a display device.

As illustrated in FIG. 11, an upper protective film PF1 is attached onto the substrate 100 including at locations thereof where the display unit 200 and the polarization layer 400 are formed. Then, a carrier glass CG which is temporarily pre-attached to the substrate 100, is separated from the substrate 100. The carrier glass CG is disposed on a second surface of the substrate 100 which is opposite to the first surface on which the display unit 200 and the polarization layer 400 are formed.

Figure 12:
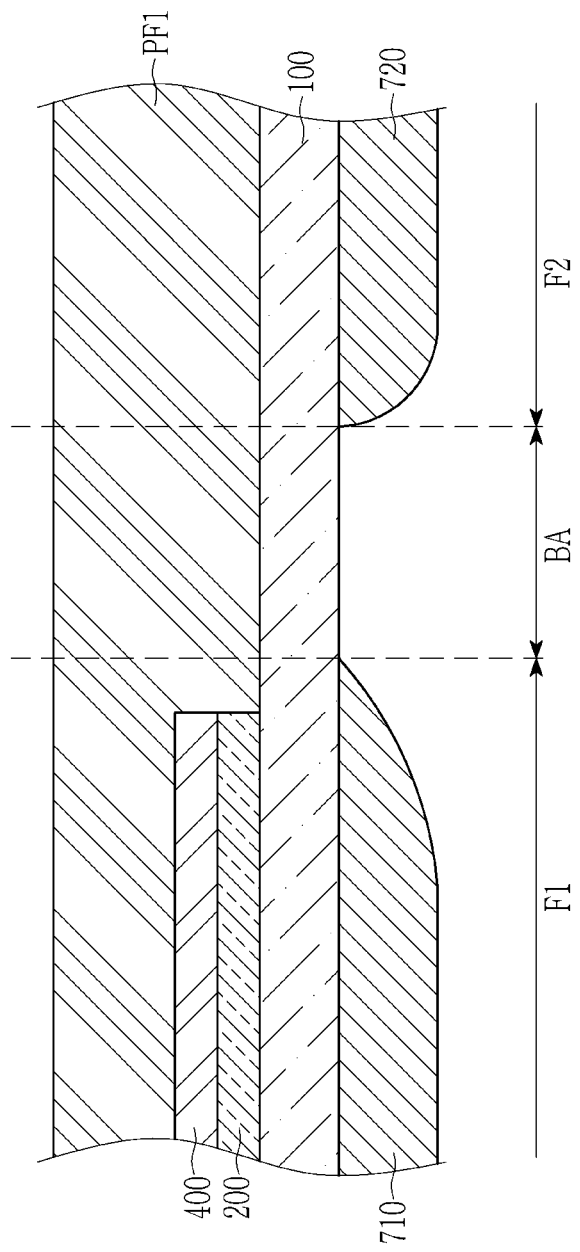

As illustrated in FIG. 12, a first passivation layer 710 and a second passivation layer 720 are formed on the second surface of the substrate 100, such as by using a printing process. The printing process may be, e.g., an inkjet process. The printing process may be performed once or a plurality of times to form the first passivation layer 710 and the second passivation layer 720. That is, the first passivation layer 710 and the second passivation layer 720 may each be formed by multiple applications of a photocurable resin, without being limited thereto.

The first passivation layer 710 and the second passivation layer 720 may be formed by applying and curing a photocurable resin. The upper protective film PF1 may remain on the first surface of the substrate 100 to protect the display unit 200 and the polarization layer 400 thereon. After the photocurable resin is cured, the upper protective film PF1 may be removed to provide a completed display device including at least the display unit 200, the polarization layer 400, the first passivation layer 710 and the second passivation layer 720 on the substrate 100.

Figure 13:
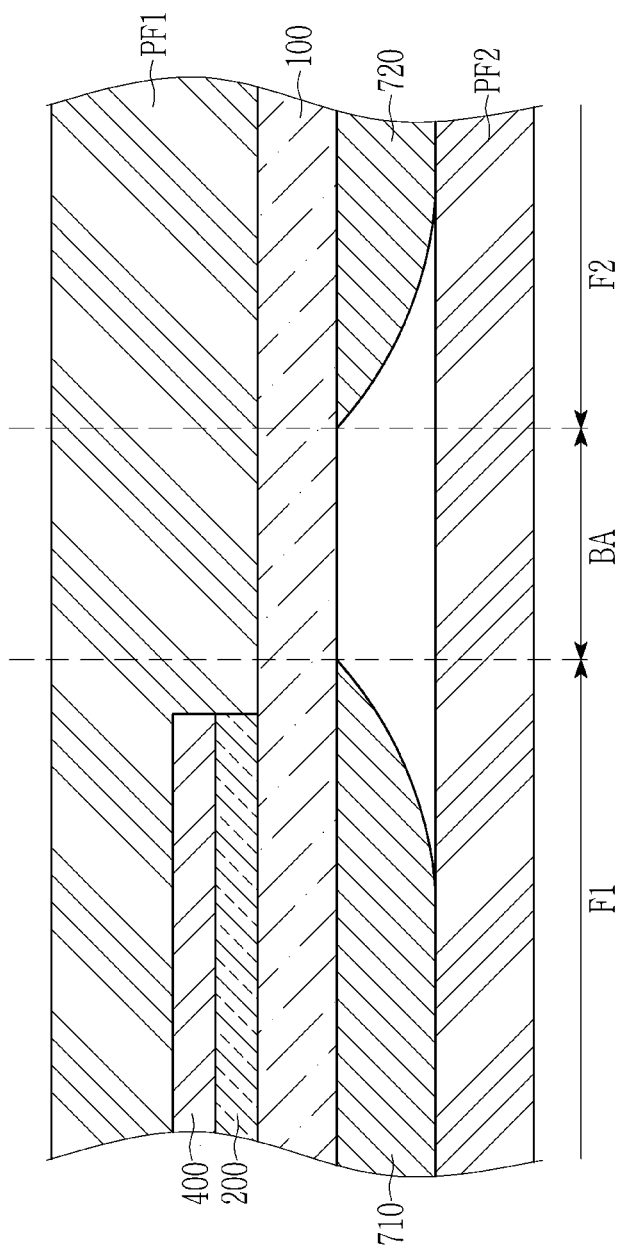

According to another exemplary embodiment illustrated in FIG. 13, a lower protective film PF2 may be attached onto the first passivation layer 710 and the second passivation layer 720 to perform remaining processes of the manufacturing method for forming a display device, after the first passivation layer 710 and the second passivation layer 720 are formed. The remaining processes may be performed after curing of the photocurable resin which forms the first passivation layer 710 and the second passivation layer 720, without being limited thereto.

It is possible to reduce or effectively prevent defects in the manufacturing process by additionally attaching the lower protective film PF2 when the substrate 100, the display unit 200, and the first and second passivation layers 710 and 720 may be damaged in the manufacturing process after the first passivation layer 710 and the second passivation layer 720 are formed.

Figure 14:
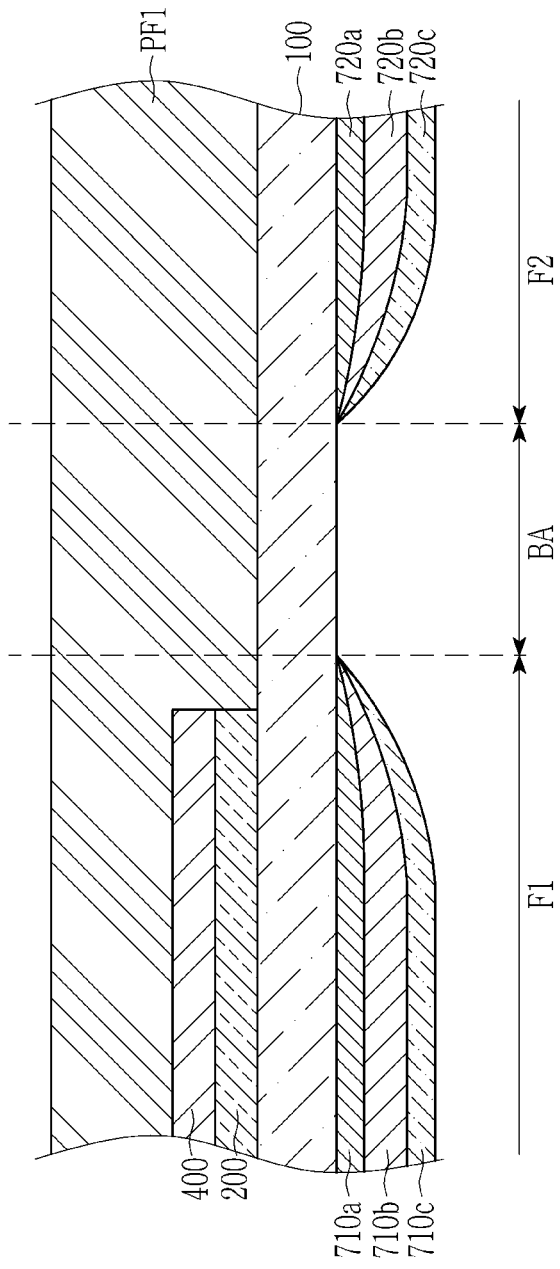

According to still another exemplary embodiment, the first auxiliary layers 710a and 720a, the second auxiliary layers 710b and 720b, and the third auxiliary layers 710c and 720c may be formed on the second surface of the substrate 100 as illustrated in FIG. 14, after a process of preparing the substrate 100 to have formed thereon the display unit 200.

Each of the first auxiliary layers 710a and 720a, the second auxiliary layers 710b and 720b, and the third auxiliary layers 710c and 720c may be formed by applying and curing different photocurable resins.

When the first auxiliary layer 710a and 720a, the second auxiliary layer 710b and 720b and the third auxiliary layers 710c and 720c include a same photocurable resin, the first passivation layer 710 and the second passivation layer 720 may be formed as a single layer. That is, each of the first auxiliary layer 710a and 720a, the second auxiliary layer 710b and 720b and the third auxiliary layers 710c and 720c are portions of the same photocurable resin. The photocurable resin included in each of the auxiliary layers has been described above, and therefore will not be described below.

During forming of the first auxiliary layer 710a and 720a, the second auxiliary layer 710b and 720b and the third auxiliary layers 710c and 720c, the upper protective film PF1 may remain on the first surface of the substrate 100 to protect the display unit 200 and the polarization layer 400 thereon. After the photocurable resin is cured, the upper protective film PF1 may be removed to provide a completed display device including at least the display unit 200, the polarization layer 400, the first auxiliary layer 710a and 720a, the second auxiliary layer 710b and 720b and the third auxiliary layers 710c and 720c on the substrate 100.

Figure 15:
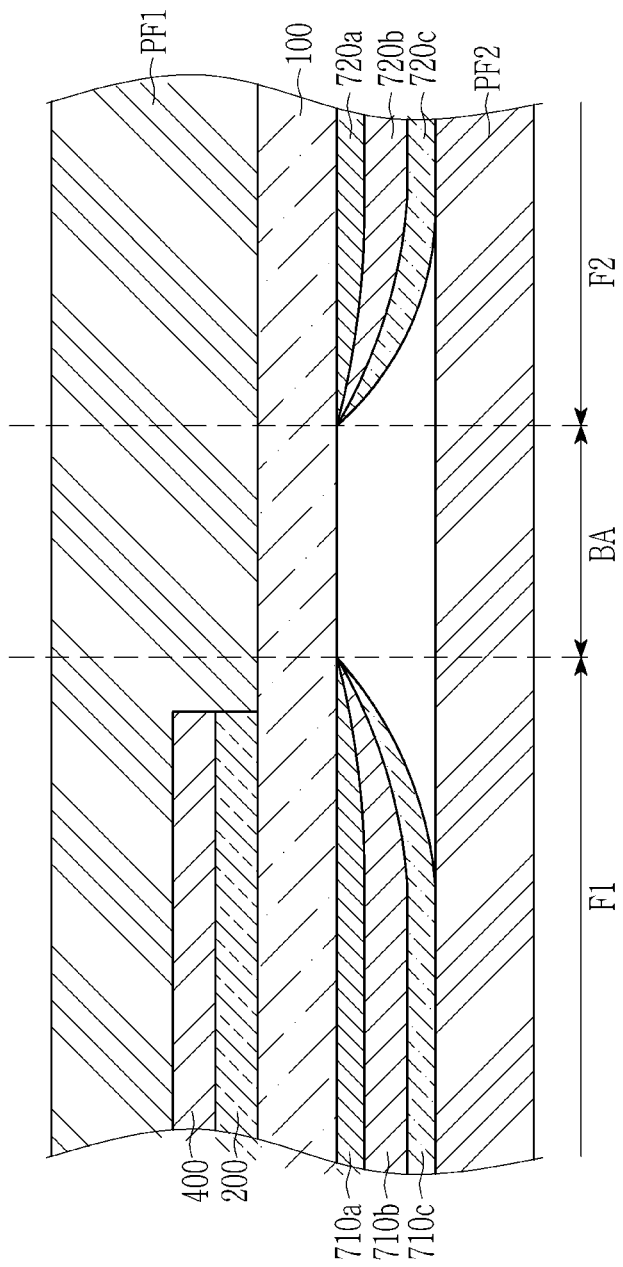

According to still another exemplary embodiment illustrated in FIG. 15, the lower protective film PF2 may be attached onto the third auxiliary layer 710c and the third auxiliary layer 720c to perform remaining processes of the manufacturing method for forming a display device, after the third auxiliary layer 710c and the third auxiliary layer 720c are formed. The remaining processes may be performed after curing of the photocurable resin which forms the first passivation layer 710 and the second passivation layer 720 respectively including the first auxiliary layer 710a and 720a, the second auxiliary layer 710b and 720b and the third auxiliary layers 710c and 720c, without being limited thereto.

It is possible to reduce or effectively prevent defects in the manufacturing process by additionally attaching the lower protective film PF2 when the substrate 100, the display unit 200, and the passivation layers 710 and 720 may be damaged in the manufacturing process after the third auxiliary layer 710c and the third auxiliary layer 720c are formed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a substrate comprising a first region, a second region, and a bending region, the bending region connecting the first region and the second region to each other;
    a display unit which displays an image, the display unit disposed on a first surface of the substrate in the first region thereof;
    an adhesive passivation layer directly on a second surface of the substrate which is opposite to the first surface thereof, the adhesive passivation layer comprising:
        in the first region of the substrate, a first passivation layer which is adhesive and directly disposed on the second surface of the substrate;
        in the second region of the substrate, a second passivation layer which is adhesive and directly disposed on the second surface of the substrate; and
        at the bending region, the first passivation layer separated from the second passivation layer to form a space therebetween which exposes the substrate to outside the adhesive passivation layer,
    wherein among the first passivation layer and the second passivation layer which form the space therebetween which exposes the substrate:
        both the first passivation layer and the second passivation layer which are adhesive include a photocurable resin which is cured,
        the second passivation layer defines an end which is closest to the bending region of the substrate, and
        the end of the second passivation layer is inclined toward the second surface of the substrate, along a direction from the second region to the bending region, and
    wherein each of the first passivation layer and the second passivation layer includes a first auxiliary layer, a second auxiliary layer, and a third auxiliary layer stacked sequentially from the second surface of the substrate.

2. The display device of claim 1, wherein among the first passivation layer and the second passivation layer which form the space therebetween which exposes the substrate:
    the first passivation layer defines an end which is closest to the bending region of the substrate, and
    the end of the first passivation layer is inclined toward the second surface of the substrate along a direction from the first region to the bending region.

3. The display device of claim 1, wherein the first passivation layer and the second passivation layer are each in contact with the second surface of the substrate, in the first region and the second region thereof, respectively.

4. The display device of claim 1, wherein a maximum thickness of the first passivation layer is about 75 micrometers to about 100 micrometers.

5. The display device of claim 1, wherein
    the first passivation layer which is adhesive and the display unit each defines an end which is closest to the bending region of the substrate, and
    the end of the first passivation layer is aligned with the end of the display unit.

6. The display device of claim 1, wherein the photocurable resin includes at least one cured product including an acrylate polymer, a polyurethane, and an acrylate compound including a SiO.

7. The display device of claim 6, wherein the photocurable resin includes at least one of an acrylic resin, a butyl rubber, a vinyl acetate resin, an ethylene vinyl acetate resin, a natural rubber, a nitrile, a silicate resin, a silicone rubber, and a styrene block polymer.

8. The display device of claim 1, wherein a maximum thickness of the second auxiliary layer is greater than a maximum thickness of the first auxiliary layer and a maximum thickness of the third auxiliary layer.

9. The display device of claim 1, wherein the third auxiliary layer included in the first passivation layer and the third auxiliary layer included in the second passivation layer are connected to each other.

10. The display device of claim 1, wherein the first auxiliary layer includes at least one of an acrylic resin, a butyl rubber, a vinyl acetate resin, an ethylene vinyl acetate resin, a natural rubber, a nitrile, a silicate resin, a silicone rubber, and a styrene block polymer.

11. The display device of claim 1, wherein the photocurable resin includes at least one cured product including an acrylate polymer, a polyurethane, and an acrylate compound including a SiO.

12. The display device of claim 1, wherein the third auxiliary layer includes at least one of, a urethane acrylate, a polyester acrylate, an epoxy acrylate, a silicone acrylate, and a hydroxy ketone.

13. A display device comprising:
    a substrate comprising a first region, a second region, and a bending region, the bending region connecting the first region and the second region to each other;
    a display unit which displays an image, the display unit disposed on a first surface of the substrate in the first region thereof;
    an adhesive passivation layer directly on a second surface of the substrate which is opposite to the first surface thereof, the adhesive passivation layer comprising:
        in the first region of the substrate, a first passivation layer which is adhesive and directly disposed on a second surface of the substrate which is opposite to the first surface thereof the substrate, the first passivation layer defining an end thereof closest to the bending region of the substrate;
        in the second region of the substrate, a second passivation layer which is adhesive and directly disposed on the second surface of the substrate, the second passivation layer defining an end thereof closest to the bending region of the substrate; and
        at the bending region, the first passivation layer separated from the second passivation layer to form a space therebetween which exposes the substrate to outside the adhesive passivation layer,
    wherein among the first passivation layer and the second passivation layer which form the space therebetween which exposes the substrate:

the end of the first passivation layer is inclined toward the second surface of the substrate, along a direction from the first region to the bending region, and the end of the second passivation layer is inclined toward the second surface of the substrate, along a direction from the second region to the bending region, and wherein each of the first passivation layer and the second passivation layer includes a first auxiliary layer, a second auxiliary layer, and a third auxiliary layer stacked sequentially from the second surface of the substrate.

14. The display device of claim 13, further comprising a polarization layer disposing the display unit between the first surface of the substrate and the polarization layer, wherein the first passivation layer corresponds to the display unit and the polarization layer, and is in direct contact with the second surface of the substrate in the first region thereof.

15. The display device of claim 13, further comprising a driver with which the display unit is driven to display the image, the driver disposed in the second region of the substrate, wherein the second passivation layer corresponds to the driver.

* * * * *